(12) United States Patent
Kwon

(10) Patent No.: US 6,901,096 B2
(45) Date of Patent: May 31, 2005

(54) MATERIAL SYSTEM FOR BRAGG REFLECTORS IN LONG WAVELENGTH VCSELS

(75) Inventor: Hoki Kwon, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/323,923

(22) Filed: Dec. 20, 2002

(65) Prior Publication Data
US 2004/0120375 A1 Jun. 24, 2004

(51) Int. Cl.[7] .................................................. H01S 5/00
(52) U.S. Cl. ............................ 372/43; 372/44; 372/45; 372/46; 372/96
(58) Field of Search ............................. 372/43, 44, 45, 372/46, 50, 75, 96; 438/479

(56) References Cited

U.S. PATENT DOCUMENTS

| | | | | |
|---|---|---|---|---|
| 5,929,461 A | * | 7/1999 | Yamaguchi et al. | .......... 257/15 |
| 6,347,108 B2 | * | 2/2002 | Jiang et al. | .................... 372/50 |
| 6,366,597 B1 | * | 4/2002 | Yuen et al. | .................... 372/96 |
| 6,546,031 B1 | * | 4/2003 | Jewell et al. | ................. 372/45 |
| 6,549,556 B1 | * | 4/2003 | Hwang et al. | ................ 372/96 |
| 6,553,048 B2 | * | 4/2003 | Jiang et al. | .................... 372/50 |
| 6,556,610 B1 | * | 4/2003 | Jiang et al. | .................... 372/75 |
| 6,583,033 B2 | * | 6/2003 | Hall et al. | .................. 438/479 |
| 6,785,311 B1 | * | 8/2004 | Najda | ........................... 372/45 |

* cited by examiner

*Primary Examiner*—Minsun Oh Harvey
*Assistant Examiner*—Dung Nguyen
(74) *Attorney, Agent, or Firm*—Workman Nydegger

(57) ABSTRACT

Distributed Bragg reflectors (DBRs), and VCSELs that use such DBRs, comprised of AlP layers on InP substrates. When grown on an InP substrate, if the critical layer thickness ($t_{crt}$) of AlP is greater than $\lambda/4n_{AlP}$, where $n_{AlP}$ is the index of refraction of InP and $\lambda$ is the wavelength, then the DBR can be grown using alternating layers of InP and AlP, wherein the thickness of the AlP is less than the critical thickness. If the critical layer thickness ($t_{crt}$) of AlP is greater than $\lambda/4n_{AlP}$, then the DBR mirror is grown using alternating layers of InP and of an AlP/InP superlattice, wherein the AlP/InP superlattice is comprised of InP and of AlP wherein the thickness of the AlP is less than the critical thickness.

18 Claims, 3 Drawing Sheets

MATERIAL SYSTEM FOR BRAGG REFLECTORS IN LONG WAVELENGTH VCSELS

UNITED STATES GOVERNMENT RIGHTS

This invention was made with the United States Government support under 70NAHB8H4023 awarded by National Institute of Science and Technology (NIST). The United States Government has certain rights in the invention.

CROSS-REFERENCE TO RELATED APPLICATIONS

Not Applicable.

BACKGROUND OF THE INVENTION

1. Field of the Invention

This invention relates to laser mirrors. More specifically, it relates to materials used for fabricating distributed Bragg reflector mirrors, and to distributed Bragg reflector mirrors made from those materials. Such distributed Bragg reflector mirrors are according to the principles of the present invention are suitable for use in vertical cavity surface emitting lasers (VCSELs).

2. Discussion of the Related Art

Vertical cavity surface emitting lasers (VCSELs) represent a relatively new class of semiconductor lasers. While there are many VCSEL variations, a common characteristic is that VCSELs emit light perpendicular to a semiconductor wafer's surface. Advantageously, VCSELs can be formed from a wide range of material systems to produce specific characteristics. In particular, material systems can be tailored to produce different laser wavelengths, such as 1550 nm, 1310 nm, 850 nm, 670 nm, and so on.

VCSELs include semiconductor active regions, distributed Bragg reflector (DBR) mirrors, current confinement structures, substrates, and contacts. Because of their complicated structure, and because of their specific material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAs) substrate 12 has an n-type electrical contact 14. An n-doped lower mirror stack 16 (a DBR) is on the GaAs substrate 12, and an n-type graded-index lower spacer 18 (a beneficially having a number of quantum wells, is formed over the lower spacer 18. A p-type graded-index top spacer 22 (another confinement layer) is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. Because an optical cavity is resonant at specific wavelengths, the mirror separation is controlled to resonate at a predetermined wavelength (or at a multiple thereof). At least part of the top mirror stack 24 includes an insulating region 40 that is usually formed either by implanting protons into the top mirror stack 24 or by providing an oxide layer. The protons can be implanted, for example, in accordance with the teachings of U.S. Pat. No. 5,115,442, which is incorporated by reference. The oxide layer can be formed, for example, in accordance with the teachings of U.S. Pat. No. 5,903,588, which is incorporated by reference. The insulating region 40 defines a conductive annular central opening 42 that forms an electrically conductive path through the insulating region 40.

In operation, an external bias causes an electrical current 21 to flow from the p-type electrical contact 26 toward the n-type electrical contact 14. The insulating region 40 and the conductive central opening 42 confine the current 21 such that it flows through the conductive central opening 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a common VCSEL structure, and that numerous variations are possible. For example, the dopings can be changed (say, by providing a p-type substrate 12), a wide range of material systems can be used, operational details can be tuned for maximum performance, and additional structures, such as tunnel junctions, can be added. However, the VCSEL 10 beneficially illustrates a useful, common, and exemplary VCSEL configuration.

While generally successful, VCSELs have problems. In particular, in some applications the prior art distributed Bragg Reflectors (DBR) are significantly less than optimal. To understand why this is so, it is beneficial to consider DBRs in more detail.

A DBR must be highly optically reflective and electrically conductive, and beneficially should be thermally conductive as well. When used in VCSELs, and particularly in long-wavelength VCSELs, a DBR must be very highly reflective to reduce optical losses to enable laser operation. Reflectivity is achieved by stacking material layers having different indexes of refraction, for example, alternating layers of AlAs and GaAs. Such stacked layers can produce an optical standing wave within the VCSEL.

While the optical performance of a DBR comprised of AlAs and GaAs is very good, to produce a VCSEL that emits a long wavelength it is beneficial to use an InP substrate. Unfortunately, because of the high degree of lattice mismatch between AlAs/GaAs and InP, it is very difficult to produce a high quality AlAs/GaAs DBR on an InP substrate. Furthermore, when attempting to do so, such as by implementing AlAs/GaAs layers that are thinner than the critical thickness (subsequently described), the group V source needs to be changed between AlAs/GaAs and InP growths (As-rich to P-rich).

The critical thickness refers to the growth thickness of an overlayer on a substrate at which the number of crystalline defects increases dramatically because of the lattice mismatch. If the overlayer and the substrate have similar crystalline structures the critical thickness is large, but if the overlayer and the substrate are highly mismatched the critical thickness is very small.

In addition to AlAs/GaAs material systems, other mirror material systems, including AlInGaAs, InGaAsP/InP, and GaAlAsSb/AlAsSb are known. Unfortunately, material systems comprised of more than two materials tend to have low thermal conductivity, which makes heat difficult to remove, and low refractive index differences, which means that many stacked layers are required. This increases fabrication costs and time. Thus, two component material systems, referred to as binary systems, are highly advantageous.

Therefore, a new material system suitable for use in VCSEL DBRs, particularly at long wavelengths, would be beneficial. Even more beneficial would be a new VCSEL DBR material system that has good thermal conductivity and that is comprised of material layers having a high index of refraction difference. Even more beneficial would be a new VCSEL DBR material system that has good thermal conductivity, that is comprised of binary material layers having high index of refraction differences, and that can be fabricated without changing the group V source during fabrication.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The principles of the present invention are directed to a distributed Bragg reflector (DBRs) mirror binary material system (AlP) that result in good thermal conductivity, that is comprised of material layers having high index of refraction differences, and that can be fabricated on an InP substrate without changing the group V source.

A DBR according to the present invention is comprised of stacked layers of Al and of P. Those stacked layers have significantly different indexes of refraction, produce a highly thermally conductive DBR, and can be fabricated on an InP substrate without changing the group V material (P).

When grown on an InP substrate, an AlP DBR will have one of two forms. If the critical layer thickness ($t_{crt}$) of AlP on an InP substrate is greater than $\lambda/4n_{AlP}$, where $n_{AlP}$ is the index of refraction of InP and $\lambda$ is the wavelength, then the DBR can be grown using alternating layers of InP and AlP, wherein the thickness of the AlP is less than the critical thickness.

However, if the critical layer thickness ($t_{crt}$) of AlP on an InP substrate is less than $\lambda/4n_{AlP}$, then the DBR mirror is grown using alternating layers of InP and of an AlP/InP superlattice, wherein the AlP/InP superlattice is comprised of InP and of AlP, wherein the thickness of the AlP in the superlattice is less than the critical thickness.

A VCSEL in accord with the principles of the present invention includes an InP substrate and at least one DBR comprised of AlP. Beneficially, the AlP layer is less than the critical thickness of AlP on InP.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

Figure 1:
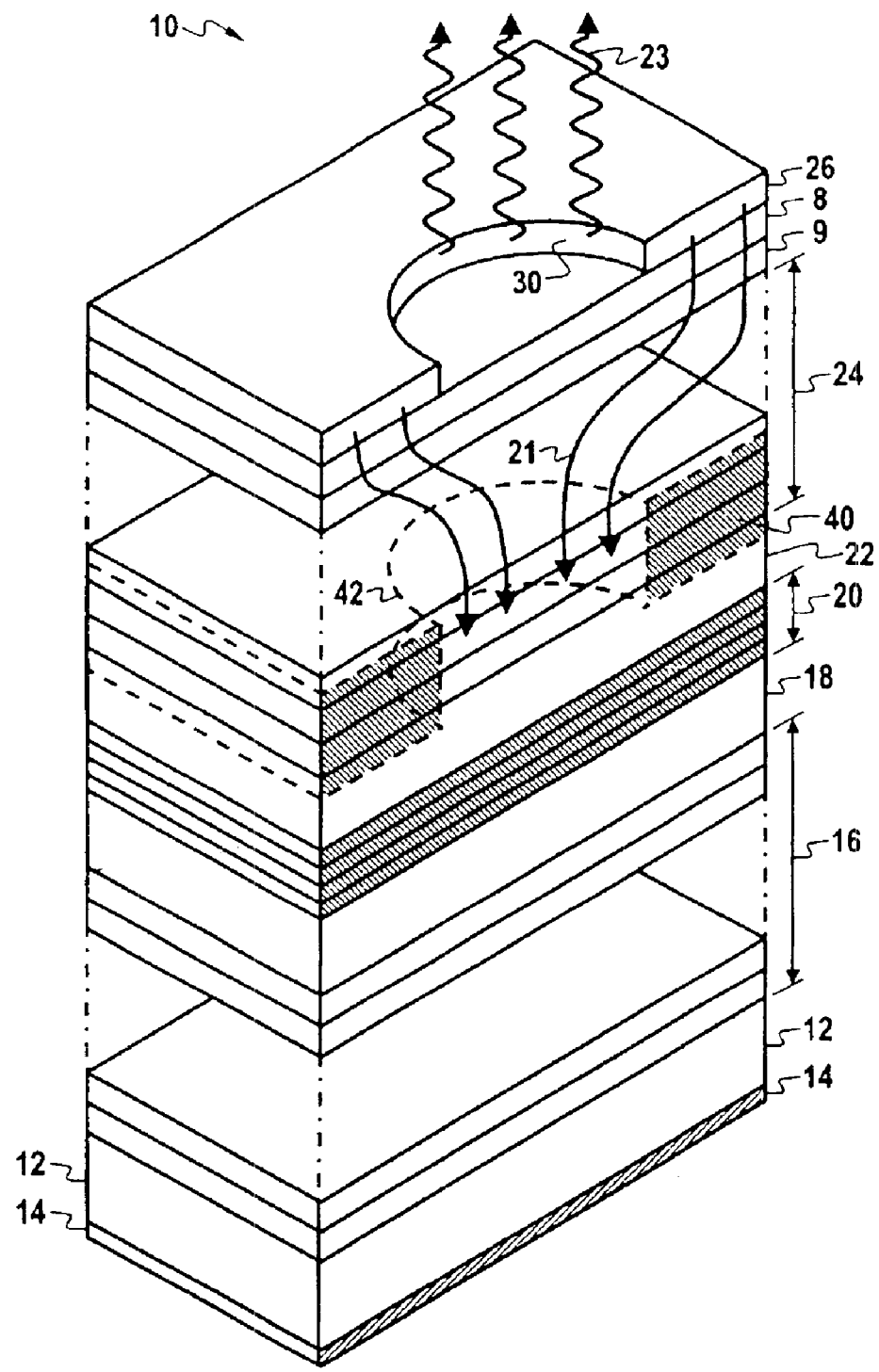
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENT

The principles of the present invention provide for DBRs comprised of stacked layers of Al and of P. Those stacked layers are beneficially fabricated on an InP substrate, and can be done so without changing the group V material (P). Furthermore, a combination of an InP substrate and an AlP DBR are particularly useful in long-wavelength VCSEL applications.

Figure 2:
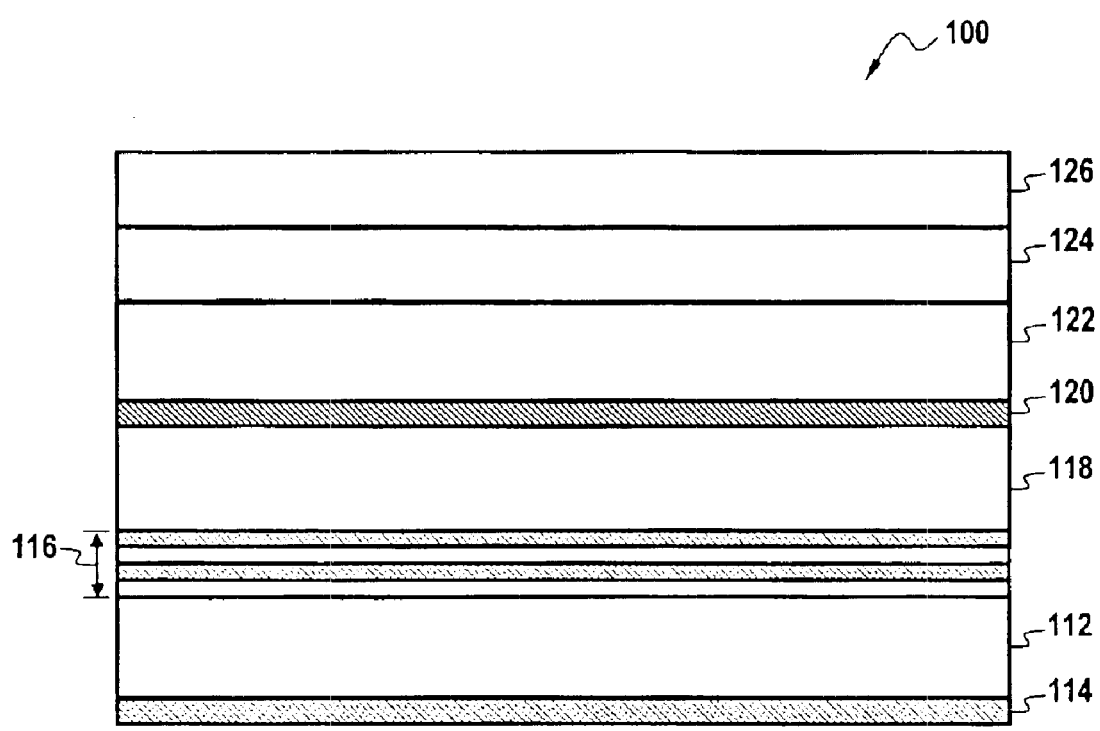
FIG. 2 illustrates a vertical cavity surface emitting laser that is in accord with the principles of the present invention.

FIG. 2 illustrates a vertical cavity surface emitting laser (VCSEL) 100 that is in accord with the principles of the present invention. FIG. 2 should be understood as a simplified "cut-away" schematic depiction of a VCSEL that is generally configured as shown in FIG. 1. Thus, similar element numbers will be used for similar elements in FIG. 2 that were used in FIG. 1. However, the VCSEL 100 includes novel and useful top and bottom distributed Bragg reflectors (DBRs).

As shown in FIG. 2, the VCSEL 100 includes an n-doped indium phosphorus (InP) substrate 112 having an n-type electrical contact 114. An n-doped lower mirror stack 116 (a DBR) comprised of AlP (aluminum phosphorus) is on the InP substrate 112. The lower mirror stack 116 is described in more detail subsequently. An n-type graded-index lower spacer 118 is disposed over the lower mirror stack 116.

An active region 120 having P-N junction structures with a large number of quantum wells is formed over the lower spacer 118. The composition of the active region 120 is beneficially InAlGaAs, InGaAsP, or InP. The active region could be comprised of alternating material layers, depending on how the quantum wells are within the active region 120.

On the active region 120 is a p-type graded-index top spacer 122. A p-type top mirror stack 124 (another DBR), which is also comprised of AlP, is disposed over the top spacer 122. The upper mirror stack 124 is described in more detail subsequently.

Over the top mirror stack 124 is a p-type conduction layer, a p-type GaAs cap layer, and a p-type electrical contact, all of which are designated as 126. As in the VCSEL 10 (see FIG. 1), the lower spacer 118 and the top spacer 122 separate the lower mirror stack 116 from the top mirror stack 124 such that an optical cavity that is resonant at a specific wavelength is formed.

It should be understood that the top mirror stack 124 includes an oxide insulating region (which, for clarify, is not specifically shown in FIG. 2, see e.g., FIG. 1.

In operation, an external bias causes an electrical current to flow into the VCSEL 100. The insulating region forms a current guide into the active region 120, where some of the electrons are converted into photons. Those photons bounce back and forth (resonate) between the lower mirror stack 116 and the top mirror stack 124. While the lower mirror stack 116 and the top mirror stack 124 are very good reflectors, some of the photons leak out as light that travels along an optical path that carries it out of the vertical cavity surface emitting laser 100.

The VCSEL 100 of FIG. 2 differs significantly from the VCSEL 10 of FIG. 1 because the VCSEL 100 incorporates a lower mirror stack 116 and a top mirror stack 124 (DBRs) that are comprised of AlP. When grown on an InP substrate, an AlP DBR will take one of two forms. If the critical layer thickness ($t_{crt}$) of AlP on an InP substrate is greater than $\lambda/4n_{AlP}$, where $n_{AlP}$ is the index of refraction of InP and $\lambda$ is the lasing wavelength, then the AlP DBRs can be grown using alternating layers of InP and AlP, wherein the thickness of the AlP is less than the critical thickness. However, if the critical layer thickness ($t_{crt}$) of AlP on an InP substrate is less than $\lambda/4n_{AlP}$, then the DBR can be grown using alternating layers of InP and of an AlP/InP superlattice, wherein the AlP/InP superlattice is comprised of InP and of AlP wherein the thickness of the AlP is less than the critical thickness.

Figure 3:
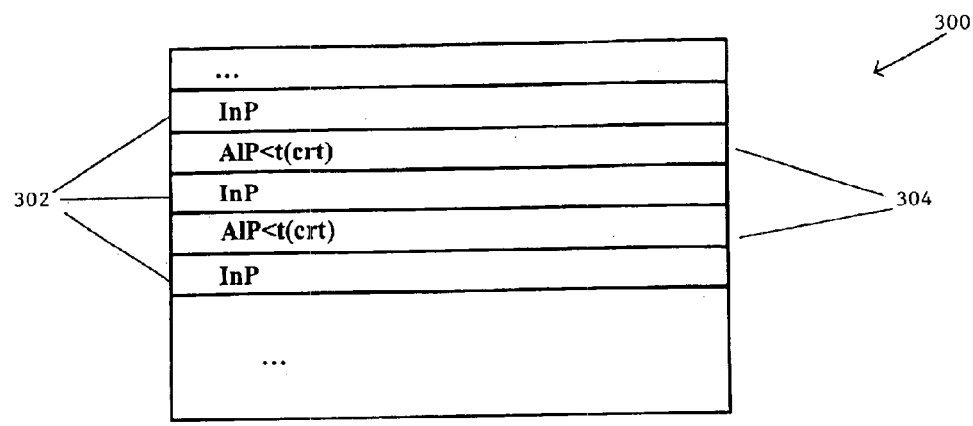
FIG. 3 illustrates an inventive DBR layer composition wherein the critical layer thickness ($t_{crt}$) of AlP on an InP substrate is less than $\lambda/4n_{AlP}$.

FIG. 3 illustrates a distributed Bragg reflector 300 wherein the critical layer thickness ($t_{crt}$) of AlP on an InP substrate is greater than $\lambda/4n_{AlP}$. As shown, the DBR 300 is comprised of alternating layers of InP 302 and of AlP 304, wherein the thickness of the AlP is less than the critical thickness.

Figure 4:
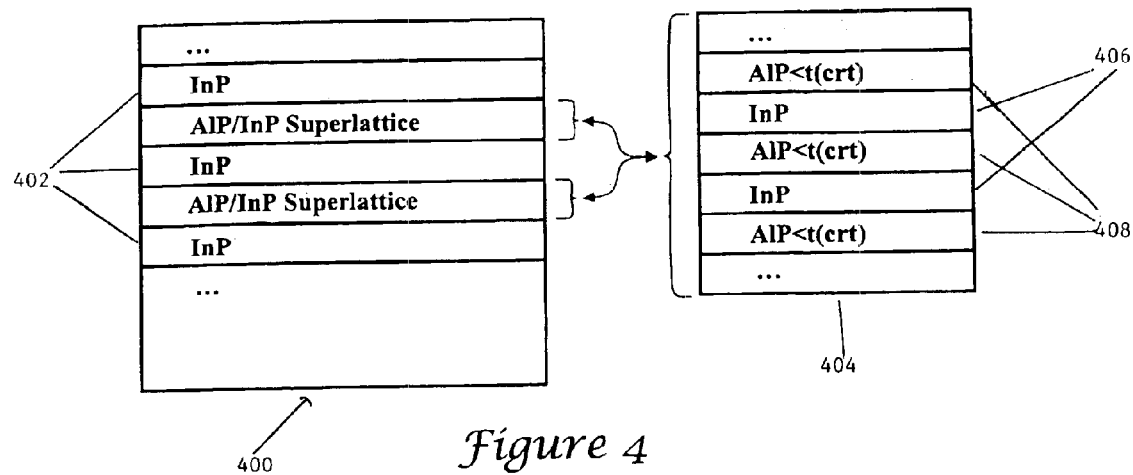
FIG. 4 illustrates an inventive DBR layer composition wherein the critical layer thickness ($t_{crt}$) of AlP on an InP substrate is greater than $\lambda/4n_{AlP}$.

FIG. 4 illustrates a distributed Bragg reflector 400 when the critical layer thickness ($t_{crt}$) of AlP on an InP substrate is less than $\lambda/4n_{Alp}$. As shown, the DBR 400 is comprised of alternating layers of InP 402 and of an AlP/InP superlattice 404. In turn, the AlP/InP superlattice is comprised of alternating layers of InP 406 and of AlP 408, wherein the thickness of the AlP is less than the critical thickness.

Significant benefits occur by using AlP in the DBRs. First, a high thermal conductivity is obtained, which enables better cooling and higher power operation. Indeed, AlP has the highest thermal conductivity of common III–V semiconductors. Second, there is no need to change the group V source when forming InP and AlP layers. Although AlP is lattice mismatched to InP substrates, AlP can be grown in a P-rich environment. This reduces the cost of growth of long-wavelength VCSEL, eases the growth procedure, and enables more productive fabrication. Additionally, since AlP has the lowest refractive index among III–V semiconductors, a smaller number of DBR layers is required to obtain the required high reflectivity. This enables even more productive fabrication techniques, reduced cost, and better throughput and performance.

The embodiments and examples set forth herein are presented to explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical cavity surface emitting laser, comprising:
    a substrate having a first surface and a second surface;
    a first contact layer on said first surface;
    an active region over said substrate;
    a doped first DBR mirror between said active region and said second surface;
    a second contact layer over said active region; and
    a second DBR mirror between said second contact layer and said active region;
    wherein said second DBR mirror is comprised of alternating layers of InP and AlP.

2. The vertical cavity surface emitting laser according to claim 1, wherein said active region has at least one quantum well.

3. The vertical cavity surface emitting laser according to claim 1, wherein said substrate is comprised of InP.

4. The vertical cavity surface emitting laser of claim 1, wherein said second DBR mirror includes an AlP layer that is thinner than $\lambda/4n_{AlP}$.

5. The vertical cavity surface emitting laser of claim 1, wherein said second DBR mirror includes an AlP/InP superlattice layer that is comprised of a plurality of AlP layers that are thinner that $\lambda/4n_{AlP}$.

6. The vertical cavity surface emitting laser of claim 1, wherein said second DBR mirror includes alternating InP and AlP/InP superlattice layers, wherein each AlP/InP superlattice layer is comprised of a plurality of AlP layers that are thinner that $\lambda/4n_{AlP}$ and that are separated by InP layers.

7. The vertical cavity surface emitting laser of claim 1, further including a first spacer between said first mirror and said active region, and a second spacer between said active region and said second mirror.

8. The vertical cavity surface emitting laser of claim 1, wherein said active region is comprised of InP.

9. The vertical cavity surface emitting laser of claim 1, wherein said first DBR mirror is comprised of alternating layers of InP and AlP.

10. A VCSEL, comprising:
    a substrate having a first type of electrically conductive dopant and first and second surfaces;
    a first contact layer, having said first type of electrically conductive dopant, formed on said first surface of said substrate;
    a first DBR mirror, having said first type of electrically conductive dopant, formed on the second surface of said substrate;
    an active region formed on said first DBR mirror and having said first type of electrically conductive dopant;
    a second DBR mirror, having a second type of electrically conductive dopant, formed on said active region; and
    a second contact layer, having said second type of electrically conductive dopant, formed on said second DBR mirror;
    wherein said second DBR mirror is comprised of alternating layers of InP and AlP.

11. The vertical cavity surface emitting laser according to claim 10, wherein said active region has at least one quantum well.

12. The vertical cavity surface emitting laser according to claim 10, wherein said substrate includes InP.

13. The vertical cavity surface emitting laser of claim 10, wherein said second DBR mirror includes an AlP layer that is thinner than $\lambda/4n_{AlP}$, wherein $\lambda$ is the wavelength of light emitted by the vertical cavity surface emitting laser.

14. The vertical cavity surface emitting laser of claim 10, wherein said second DBR mirror includes an AlP/InP superlattice layer that is comprised of a plurality of AlP layers that are thinner that $\lambda/4n_{AlP}$, wherein $\lambda$ is the wavelength of light emitted by the vertical cavity surface emitting laser.

15. The vertical cavity surface emitting laser of claim 10, wherein said second DBR mirror includes alternating InP and AlP/InP superlattice layers, wherein each AlP/InP superlattice layer is comprised of a plurality of AlP layers that are thinner that $\lambda/4n_{AlP}$ and that are separated by InP layers, wherein $\lambda$ is the wavelength of light emitted by the vertical cavity surface emitting laser.

16. The vertical cavity surface emitting laser of claim 10, further including a first spacer between said first mirror and said active region, and a second spacer between said active region and said second mirror.

17. The vertical cavity surface emitting laser of claim 10, wherein said active region is conprises of InP.

18. The vertical cavity surface emitting laser of claim 10, wherein said first DBR mirror is comprised of alternating layers of InP and AlP.

* * * * *